Figure 1:
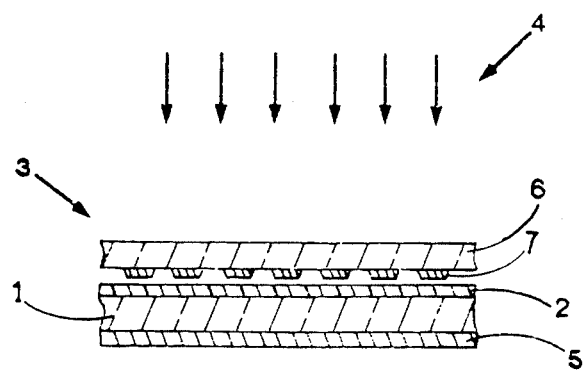

United States Patent [19]

Hecq et al.

[11] Patent Number: 4,797,316
[45] Date of Patent: Jan. 10, 1989

[54] ETCHED GLASS AND PROCESS OF MANUFACTURING SAME

[75] Inventors: André Hecq, Nalinnes; René Ledroit, Les Bons Villers, both of Belgium

[73] Assignee: Glaverbel, Brussels, Belgium

[21] Appl. No.: 129,962

[22] Filed: Dec. 4, 1987

[30] Foreign Application Priority Data

Dec. 23, 1986 [LU] Luxembourg .......................... 86722

[51] Int. Cl.$^4$ .......................... B32B 3/28; B44C 1/22; C03C 15/00; C03C 25/06
[52] U.S. Cl. ........................................ 428/167; 65/31; 156/643; 156/646; 156/657; 156/659.1; 156/653; 156/663; 204/192.37; 369/279; 428/170; 430/321; 430/323
[58] Field of Search .................... 65/31; 156/643, 646, 156/651, 654, 657, 659.1, 663, 653; 427/165; 428/163, 167, 170; 369/272, 275, 277, 278, 279, 280; 430/321, 323; 204/192.32, 192.37

[56] References Cited

U.S. PATENT DOCUMENTS

| | | | |
|---|---|---|---|
| 3,817,730 | 6/1974 | Uchida | 65/31 X |
| 4,046,619 | 9/1977 | Rice et al. | 156/663 X |
| 4,106,859 | 8/1978 | DoRiguzzi et al. | 65/31 X |
| 4,544,443 | 5/1984 | Ohta et al. | 156/643 |
| 4,655,876 | 4/1987 | Kawai et al. | 156/663 X |
| 4,726,006 | 2/1988 | Benne et al. | 156/663 |

FOREIGN PATENT DOCUMENTS 0228814 11/1986 European Pat. Off. .

Primary Examiner—William A. Powell
Attorney, Agent, or Firm—Spencer & Frank

[57] ABSTRACT

The invention relates to an article comprising a glass sheet and having an etched pattern, and to a process of manufacturing an article comprising a glass sheet and having an etched pattern.

The glass sheet 11 is a chemically tempered glass sheet, and the pattern comprises one or more grooves 10 etched into the article using fluorine ions to a depth of less than 2 $\mu$m. The etched grooves 10 constituting the pattern may be formed in a layer 12 of inorganic material such as $SiO_2$. They may have a width of less than 10 $\mu$m and the spacing (p) between two adjacent grooves may also be less than 10 $\mu$m.

The etching may be performed by applying a layer of radiation-sensitive material to at least one face of that sheet and exposing it to radiation to form a latent image of a desired groove pattern, whereafter the radiation-sensitive material is developed to form a resist and the sheet is exposed, through the resist, to the action of fluorine ions in an etching medium to etch the desired groove pattern to a depth of less than 2 $\mu$m.

The invention is particularly useful for forming storage discs for recording data and also for forming panels of high optical transmittance.

57 Claims, 1 Drawing Sheet

ETCHED GLASS AND PROCESS OF MANUFACTURING SAME

This invention relates to an article comprising a glass sheet and having an etched pattern. The invention extends to a process of manufacturing an article comprising a glass sheet and having an etched pattern.

In the field of decorative arts, it is known to etch sheets of glass with various decorative patterns, that is to say patterns normally intended to be perceived and examined with the naked eye, and it is also well known in the field of glassware in general to etch a manufacturer's mark or quality mark into a surface of the glass. Such etchings, being designed to be visible to the naked eye, tend to consist of rather broad lines.

It is also well known to provide matted glass sheets by etching uniformly over substantially the whole area of one or both faces of a glass sheet.

It is also known, for example from U.S. Pat. No. 4,544,443 assigned to Sharp KK, to provide an optical data storage disc by etching guide tracks onto a glass sheet in the form of a disc. Such grooves are necessarily very fine in order to allow the storage of sufficient data on the disc, and they may for exmample have a depth of 5 nm and a width of about 1 $\mu$m. However, according to Sharp KK's later European Patent publication No EP 0 228 814 A1, the smoothness of the surface of the glass substrate according to that U.S. Patent is significantly damaged by the etching operation, which causes an increase in noise in the resulting optical data storage disc.

Glass is a brittle and rather fragile material. Glass sheets can easily be given extra strength and resistance to breakage by making them thicker, but this is not always possible in practice. For example the physical size of many available optical storage disc readers demands a disc thickness below 2 mm. Glass discs having such thickness are quite fragile, and there is a considerable risk that they may be damaged by handling. Also, if the disc has to be rotated very rapidly, for example for reading or writing the stored data, it may be apt to break under the centrifugal stresses set up. A high strength/weight ratio is also desirable in other fields of use of etched glass sheets.

It is an object of this invention to provide an article comprising a glass sheet and bearing an etched pattern which is of improved strength and resistance to breakage.

According to this invention there is provided an article comprising a glass sheet and having an etched pattern, characterised in that said glass sheet is a chemically tempered glass sheet, and the pattern comprises one or more grooves etched into the article using fluorine ions to a depth of less than 2 $\mu$m.

It is extremely surprising that it is possible to etch a pattern of grooves onto a tempered glass sheet. Tempered glass is well known to be very sensitive to surface attack, and the formation of any groove in its surface would be liable to act as a stress raiser. Because of the very high compressive surface stresses set up in the surface of the glass during chemical tempering and the way in which these stresses decrease from the surface into the interior of the glass sheet, it would be expected that any non-uniform surface attack, especially one which was likely to result in V-shaped or rectangular grooves, which give a high probability of breaking, or at the least strongly distorting the tempered glass sheet.

To our surprise, we have found that this is not the case, and that provided the depth of the etching in the tempered glass is controlled to below 2 $\mu$m, it is possible to etch a grooved pattern while maintaining the advantages of hardness and high strength, and without disturbing the planeity of the tempered glass.

Chemical tempering of glass is of course well known per se, and it is not considered necessary here to go into detail of chemical tempering procedures. It is sufficient to note that such tempering is based on the substitution, by ion diffusion, of sodium ions in the surface layers of the glass. The sodium ions may be replaced by potassium ions which are larger than sodium ions and so give rise to compressive surface stress. In an alternative procedure, the sodium ions are replaced by lithium ions which confer a lower coefficient of thermal expansion on the surface layers of the glass: again compressive surface stresses are set up in the glass.

Etching with fluurine ions being a treatment wherein there is generally a leaching out of the alkali metal ions, it is surprising that most of the benefit of chemically tempering a glass sheet is not lost when it is etched. We have surprisingly found that this is not the case with an article according to this invention.

An article having the combination of features of the present invention has, for a given thickness of glass sheet, an improved strength and resistance to breakage, and it confers the advantages of transparency (if desired), easy attainment of a high degree of planeity, chemical stability and resistance to ageing, and hardness, all associated with the use of glass.

In preferred embodiments of the invention the pattern comprises closely spaced groove portions which have a width less than 10 $\mu$m, and the spacing between two adjacent groove portions is less than 10 $\mu$m.

Such a sheet of glass is particularly valuable since it offers virtually microscopic etched grooves suitable for numerous novel applications.

It is surprising that a material as hard as a tempered glass can bear such thin etched grooves which are so close to one another, and the applicant company was particularly surprised to find that it is possible to obtain such an etching directly in a surface having at least the hardness of a glass.

This preferred feature of the invention offers a very substantial advantage relative to conventional practice which requires the application of a resin layer to take the grooved pattern, since it offers a sheet of tempered glass which bears a very fine etching, having high resolution, produced in a very hard surface.

Preferably, the etched groove portions have a width less than 1.5 $\mu$m and a depth greater than 50 nm, and the interval between two adjacent groove portions is less that 2 $\mu$m.

This feature improves the high resolution of the etched pattern, and its examples such a sheet of glass to be used directly, for example, for the production of a data storage disc. Moreover, such depths provide a substantial relief effect relative to the width of the grooves, which can only prove to be a very marked advantage when the pattern is intended to serves as a guide track of a data storage disc, for example.

According to some preferred embodiments of the invention, the pattern is etched into a surface layer of the tempered glass sheet. This solution is very valuable since the glass itself constitutes the support for a very fine and high-resolution etching, and there is therefore a complete absence of any foreign material on the substrate, which makes it possible to take advantage of the properties peculiar to the glass, such as stability, surface evenness, transparency etc.

In certain cases, however, the complexity of the chemical corporation of the glass makes the work of etching very delicate. It is for the reason in particular, according to other advantageous embodiments of the invention, that it is preferred for the etched groove portions to be etched in a layer of inorganic material deposited on the glass, which material has a hardness which is substantially equal to or greater than the hardness of the said glass. This solution makes it possible, while retaining the surface qualities in respect of hardness, to obtain an extremely fine pattern in a surface which is better adapted to etching than the glass itself. This also makes it possible, for example, to carry out passivation of the surface of the glass at the same time, in order to prevent, if appropriate, the diffusion of ions such as sodium or potassium ions in layers intended for the recording of data and deposited subsequently. By judiciuos selection of a layer having an appropriate refractive index this can likewise make it possible to reduce undesired reflections at the interface between the substrate and the subsequent layers, which may prove advantageous in the case of optical reading of recorded data, for example.

The expression "surface whose hardness is substantially equal to or greater than the hardness of the said glass" is to be understood, in the prsent description and also in the claims, as meaning that this surface possesses a hardness which is at least of the same order of magnitude as the hardness of ordinary glass. It therefore refers to a surface which can be qualified as hard, as opposed in particular to a layer of ordinary resin or to a plastic.

In this context, various very hard layers may be envisaged, but it is preferable for this hard layer to comprise substantially a single constituent. This feature is very favourable for obtaining a high quality etching, since the problems inherent in etching with fluorine ions are more easily overcome with a material comprising a single constituent that with a material comprising a plurality of constituents and obtained from a plurality of compounds, as is the case with most conventional vitreous materials. If the etching operation if facilitated, the result will be of better quality.

Oxides such as $TiO_2$ may be specifically cited as an example of such layers, but $SiO_2$ will preferably be chosen. This compound makes it possible to obtain uniform and transparent layers, which is a particularly important asset since they retain the advantage of the properties of the glass. The layers thus formed can be very compact and do not detract from the high surface evenness which can be obtained for the glass. It is also possible to etch them with relatively greater ease than the glass.

It is rather surprising that it is possible to form such a hard inorganic layer on a sheet of chemically tempered glass without losing a large part of the benefit of the tempering treatment. Known techniques for depositing layer of for example $SiO_2$ inevitably involve heating the sheet and it would be expected that this heating would allow the compressive surfaces set up in the glass by the tempering treatment to become relieved to a substantial extent. Surprisingly this is not necessarily so.

In the case where the pattern is etched in a hard inorganic layer, it is particularly advantageous for the depth of the etched lines to be substantially equal to the thickness of the inorganic layer. If it has been possible for the hard inorganic layer to be deposited in a uniform manner, this feature can ensure exemplary regularity of the thickness of the etched lines of the pattern as a whole, especially when the inorganic layer is of a material which is more easily etched than glass, and this facilitates the provision of a high-precision pattern.

Preferably, the sheet of glass according to the invention bears an anti-reflecting layer. This layer makes it possible to avoid undesired reflections when observing the etched pattern. This improvement proves very useful when the etched pattern is to be scanned optically. In many cases, it will be possible to obtain this effect by means of a layer having a refractive index which is intermediate between that of the substrate surface and that of the material which will cover the face of the substrate in use, which makes it possible to reduce diffractions at this interface. By way of example, for the magneto-optical disc, the special magnetic layer intended to receive the data generally possesses a refractive indesx of the order of 2. A layer possessing a refractive index of between 1.5 and 2, or slightly less than 2, will give notably important benefits. In the case of magneto-optical discs, such an anti-reflecting layer augments the Kerr effect.

The glass used may be drawn glass, but in preferred embodiments of the invention, said glass sheet is a float glass sheet, to give the advantage of generally improved surface planeity.

The glass sheet may be made to any desired thickness, but the advantages afforded by the present invention are particularly manifest in a said glass sheet which has a thickness below 2 mm, as is preferred. Glass sheets of such thickness have the additional advantage of being usable as data storage discs which can be read by known and commercially available equipment.

In some preferred embodiments of the invention, the pattern is etched on a face of the article with grooves disposed mesh-wise to form a grid pattern, the dimension of the mesh being less than 0.5 $\mu$m and the total optical reflectance of that face within the visible region of the spectrum being less than 4%. Preferably, the width of the etched lines is substantially the same as the width of the intervals between the lines.

It has been found, surprisingly, that a sheet of transparent glass etched with such a pattern possesses a total optical transmittance greater than the same sheet of glass without the etching. This is quite surprising, since lines etched in relief on the surface of the sheet normally tend to create undesired reflections which diffuse a relatively substantial portion of the light, so that the optical transmittance may be greatly reduced thereby. In fact, according to a possible explanation, the dimesion of the mesh of the grid is so small that it is less than the wavelength of the light, so that diffusion is thus avoided.

In order to obtain a sheet of glass having high optical transmittance, it is known to apply to the sheet several successive transparent layers forming an anti-reflecting interference filter having a refractive index which varies from the refractive index intrinsic to the glass to the refractive index of air, that is to say n=1. In the case of an ordinary alkali-lime glass, the refractive index "n" is approximately equal to 1.5. The ideal would be for n to vary in a continuous manner between 1.5 and 1, from the glass to the outer surface layer. This, however, would assume an infinite number of successive layers, which is manifestly completely prohibitive.

Because of the particular etching in grid form, the mesh thereof has a dimension of less than 0.5 μm, and if in addition the etched grooves are wider at the surface of the sheet than they are at the bottom, the sheet of glass according to the invention makes it possible to simulate this ideal situation without it being necessary for any layer to be deposited on the sheet. A possible explanation of this phenomenon is that as the dimensions of the mesh are exteremely small, each successive level of the etched surface may be substantially equated with a homogeneous layer. The outer surface level contains little vitreous material and much air, and therefore possesses a refractive index close to that of air. By contract, the level situated at the bottom of the etching can be equated with a layer of glass from the point of view of the refractive index.

Ideally, in order to obtain the best effect of continuity between the refractive index of the glass and that of the air, the grooves, that is to say the etched lines, and the projecting parts of the grid preferably have, in section, the general appearance of triangles, the apices of these triangles being slightly rounded.

However, even if the grooves and the projecting parts of the grid possess, in section, a generally rectangular appearance with sides substantially prependicular to the sheet, the invention is already of very notable value since the layer of etched glass will possess a refractive index between that of the core sheet and that of the surrounding atmosphere. The result thus obtained will be the simulation of a layer having an intermediate refractive index.

Preferably, the depth of the etched lines is greater than 0.1 μm. This depth makes it possible to obtain a very notable reduction in the optical reflectance of the etched face. A scale of adequate depth can be defined between 0.1 and 1 μm.

The best dimension of the mesh of the grid will essentially depend on the wavelength of the radiation to which the sheet is normally subjected during use. If this radiation is in the region between approximately yellow and near infrared, a figure slightly less than 0.5 μm gives very notable benefits for obtaining a very unreflective face. To obtain good results throughout the visible region, the mesh is given a dimension which is distinctly inferior to 0.5 mm. In this context, the dimension of the mesh of the grid is preferably below 0.1 μm. By virtue of this small dimension, it is possible to avoid the slightly bluish appearance of the face of the sheet and thus obtain a colourless appearance.

The invention extends to a panel comprising at least one sheet of tempered glass as described above. This panel may, for example, constitute a solar cell and comprise a sheet bearing an etched pattern in grid form according to the invention. The reduction of the undesired reflections consequently improves the performance of the solar cell.

In other preferred embodiments of the invention, the etched groove portions form a spiral guide track whose pitch is less than 2 μm. Alternatively, etched grooves form a guide track being a series of concentric circles whose pitch is less than 2 μm. Preferably such article is in the form of a disc.

Such discs make an important contribution to improving the quality and cost price of storage discs for data recording. This is likewise of value for any other substrate where it is absolutely essential to have a guide track or a receiving groove having a micrometric pitch.

In the field of data storage discs, in particular opticaly readable and/or writable discs, whether erasable (rewritable) or not, as for example optical numerical discs or magneto-optical discs, it is in general necessary to dispose a track serving to guide the system of recording or reading. One characteristic example which may be cited is that where the recording and/or reading is done by means of a laser beam focused on the surface carrying the information and condensed into a diameter of about 1 μm. In order to allow the information to be stored at a high density, it is necessary to form a track with a spacing which is micrometric. During reading or writing the displacement of the laser beam radially of the disc must be so precise that is it difficult to achieve the necessary degree of accuracy by a purely mechanical ssytem. Accordingly the disc carries a track which serves as a guide for the laser beam and use is made of a servo system operated electronically. Such a system may be based on diffraction of the laser beam by the etched lines, in particular by the sides of the grooved pattern, which modulates an electric signal in dependence on changes in the amplitude or the phase of the diffracted beam to control a servo system which effects running correction of the position and focus of the beam so that it properly follows the guide track.

It will be understood that, in order to form the groove pattern, various possibilities may be adopted depending upon the result which it is desired to obtain. The guide tracking may be controlled by scanning a pair of etched lines, or by scanning a single etched line. The etched lines may be continuous, or they may be interrupted, for example the pattern may be constituted by a regularly interrupted line whose general course nevertheless represents a said spiral, or by a plurality of interrupted arca which represent the concentric circles. The groove pattern may thus be constituted by a succession of short etched lines at a distance from one another. In the case where tracking is controlled by scanning a pair of interrupted lines, the short etched grooves, which may simply be pits, may be in register or not, and their lengths and spacings may be uniform, or they may be of different lengths, coded to give addressing information.

It is generally conceded that a glass disc possesses notable advantages, particularly by virtue of its surface evenness and condition, essentially because of its firepolished aspect. It also possesses incomparable chemical stability. The presence of a layer of resin on such a substrate, which is conventionally done in order to form the guide track therein, results in at least the partial loss of these advantageous properties and may be disadvantageous for the purposes of a data recording layer.

The sheet of glass according to the invention makes this particular layer superfluous, since the sheet itself bears the desired guide track, etched on one of its faces. The groove defined by the etched lines on the face of the sheet to constitute the said spiral or concentric circle pattern which serves as a guide track for the laser beam will have, for example, a depth of about 70 nm. If these etched lines are produced in a hard layer deposited on the glass, such as an $SiO_2$ layer, this layer also will preferably be of 70 nm.

For optical digital discs or for magneto-optical discs, for example, it is generally necessary for the pitch of the guide track to be 1.6 μm, and for the groove to have a width of about 0.6 μm. The layer intended to contain the data will be deposited on the pre-etched face, after suitable cleaning of the surface, so as to benefit from the fire-polished aspect of the glass. The data may be recorded in the bottom of a continuously etched track, or on an unetched surface between a pair of discontinuously etched tracks.

Preferably, the bottom of the groove defining the said guide track possesses a rugosity Ra below 10 nm, and preferably below 5 nm. This rugosity figure, which is calculated as the arithmetic mean of the departures of the roughness profile from the mean line, can validly be close to that of drawn glass or float glass. In the case of optical reading, for example, this substantially improves the effects due to reflection and greatly reduces parasitic signals or background noise. The feature also gives a surface condition which is acceptable for supporting a layer intended to receive recorded data, for example in digital form.

Preferably, likewise, the sides of the groove possess a substantially symmetrical inclination relative to an axis perpendicular to the bottom of the groove. This feature makes it easier to control the movement imposed on the device which may have to follow the said groove, since the signals originating from the sensing of the said sides are thus easier to process.

A said disc is suitably adapted for the storage of recorded data. If the etched pattern constitutes a guide track for such a disc, such pattern is preferably addresswise modulated. The invention thus provides a pre-formatted data storage disc which may for example carry information for synchronising and addressing different sectors and tracks.

In some preferred embodiments of the invention, the etched pattern is over-coated with a data-recording layer. The invention thus provides a data-storage disc which can be written to and/or read by the user, for example by means of a laser.

In other preferred embodiments of the invention, the etched pattern is data-wise modulated. The invention may thereby be used to provide a read-only data storage disc, in which the information is recorded directly onto the glass or a hard inorganic layer thereon, without the need for a relatively soft resin layer. This is of particular value for archive purposes, because such an etched pattern has a high degree of permanence.

The invention includes a process of manufacturing an article comprising a glass sheet and having an etched pattern.

The process according to the invention is characterised in that a glass sheet is chemically tempered, a layer of radiation-sensitive material is applied to at leaset one face of that sheet and is exposed to radiation to form a latent image of a desired groove pattern, in that the radiation-sensitive material is developed to form a resist and in that the sheet is exposed, through the resist, to the action of fluorine ions in an etching medium to etch the desired groove pattern to a depth of less than 2 μm.

Etching with fluorine ions being a treatment wherein there is generally a leaching out of the alkali metal ions, it is surprising that most of the benefit of chemically tempering a glass sheet is not lost when it is eteched. We have surprisingly found that this is not the case with a process according to this invention.

A process having the combination of features of the present invention affords, for a given thickness of glass sheet, and etched article having improved strength and resistance to breakage, and it confers the advantages of transparency (if desired), easy attainment of a high degree of planeity, chemical stability and resistance to ageing, and hardness, all associated with the use of glass.

The radiation imprints the sensitive material. This radiation can, for example, be directed at the sensitive material in the form of a thin beam which moves in accordance with the pattern to be etched, following a template or being piloted in a precise manner by electronic means, which makes it possible to form the desired latent image in the sensitive material. By way of example, a laser beam can be used, and a relative movement produced between the substrate bearing the sensitive material and this laser beam, in a manner such as to trace the said pattern. It is thus possible to generate in the sensitive material an image of the pattern to be etched. Depending on the type of sensitive material used and the type of radiation, the latent image may be self-developing, for example because the irradiated zone become coloured, evaporate or disappear under the effect of these radiation, or the image may be a latent image which is developed or revealed in a subsequent developing step.

The subsequent development of the latent image, where relevant, may be of the photographic type making use of a developer and a fixer. It is thus possible to differentiate the zones of the pattern in the resist by imparting to them a different mechanical or chemical resistance under the action of the radiation, and then removing the least resistant zones. For example, the irradiated zones can harden under the action of the radiation, in which case the non-irradiated zones will then be removed, or conversely the irradiated zones will be less resistant, in a manner such as to permit them to be removed without spoiling the zones which have not been irradiated. Depending on the case, this removal will be effected, for example, by simple brushing or with the aid of a solvent.

Subject to suitable precautions, the use of a radiation-sensitive material makes it possible to obtain a precise and high-resolution resist on the substrate. By subjecting the substrate provided with this resist to the action of an etching medium containing fluorine ions, it is thus possible to etch it in accordance with a very precise pattern.

A metallic resist may, for example, be produced. In this case it is possible to operate in several stages, initially producing a first resist which will in general be organic. On this first resist, it is then possible to deposit a metallic layer which clings to the material of the face of the substrate which is not protected by the organic resist. The intermediate organic resist is then removed to leave only a metallic resist which will remain on the substrate after the action of the etching medium, in a manner such as to provide protection. It is apparent that the various resists must be either positive or negative, depending on the case, in order to obtain the intended final pattern.

After the action of the etching medium, the sensitive material still present on the substrate, which has acted as a resist, may therefore remain there in order to provide subsequent protection if appropriate. Preferably, however, the resist is eliminated from the substrate after the action of the etching medium. This provides a finished product devoid of any superfluous mark originating from the etching process.

The pattern can be etched in the glass itself, in which case the etching medium will remove the glass. This solution makes it possible to obtain a substrate etched in the mass, which makes it possible to benefit from the properties of the glass in the absence of any other material, and in general will be much appreciated as such. In othere cases, it will be preferable for an inorganic layer to be present on the face of the glass prior to the deposition of the radiation-sensitive material, and the material removed during etching will consequently comprise material originating from this inorganic layer. It is preferable to select an inorganic layer which possesses a hardness of the same order of magnitude as the glass, which does not impair the surface condition and particularly teh surface evenness of the glass, which can be easily deposited in a uniform manner without spoiling or distorting the substrate, and which is easier to etch than the glass itself. This therefore has the important advantage of facilitating etching without impairing the intrinsic properties of the vitreous substrate material. The difficulty in etching glass generally originates from the fact that this is a hard material formed of several constituents which may have quite different reactions under the effect of the etching medium. This problem is avoided if the vitreous substrate bears an inorganic layer formed by a single constituent, for example an oxide. An inorganic layer which deserves particular attention is a layer of $SiO_2$. This is a very hard transparent layer capable of being deposited in a uniform manner and in a very thin layer without impairing the surface evenness of the glass. In respect of etching, layers of a silicon compound have the important advantage of being able to form a volatile compound $SiF_4$ in the presence of fluorine ions in the etching medium, which facilitates fine and precise etching.

It is rather surprising that it is possible to form such a hard inorganic layer on a sheet of chemically tempered glass without losing a large part of the benefit of the tempering treatment. Known techniques for depositing layer of for example $SiO_2$ inevitably involve heating the sheet and it would be expected that this heating would allow the compressive surfaces set up in the glass by the tempering treatment to become relieved to a substantial extent. Surprisingly this is not necessarily so.

The inorganic layer is preferably deposited to a thickness substantially equal to the depth of the pattern to be etched. This makes it possible to derive maximum benefit from the presence of the layer without excess material. A thickness of 70 nm, for example, may be suitable for an inorganic layer in which a groove is etched to serve as a guide to a laser beam.

In this case, the action of the etching medium is preferably stopped when the latter reaches the glass over substantially the entire surface of the pattern to be etched. This procedure makes it possible to obtain a pattern of exemplary regularity of thickness. In effect, it is possible to take advantage of the fact that the rate of reaction is different between the material of the inorganic layer and the glass. In particular, it is possible to take advantage of the fact that when the etching medium reaches the glass a compound forms which blocks the reaction. It is thus possible to etch a pattern to a depth which is substantially equal to all points to the thickness of the inorganic layer, and hence has excellent regularity.

Even if no metallic resist is used, the sensitive material exposed to the radiation may also, if appropriate, serve to form an intermediate resist which will not be that serving to protect the glass or the material of the surface of the substrate against the action of the etching medium. This latter result will then be constituted by means of the intermediate resist.

Preferably, however, the said resist which directly protects the face of the substrate during the action of the etching medium is constituted by the said sensitive material after exposure to the radiation. This procedure ensures better reliability and better precision of the etching, by viture of the reduction in the immediate stages, and the cost price of the etching operation is thereby reduced.

The radiation utilized to imprint the sensitive material may, for example, be constituted by a particular radiation. This may be a neutron beam. It is then sufficient to use a material sensitive to this type of radiation. Alpha or beta radiation may also be used.

Preferably, the said radiation is electromagnetic radiation. This type of radiation is simpler to produce and to use. It is possible to use x-radiation or gamma radiation, but also a radiation of micrometric wavelength.

Advantageously, however, the radiation-sensitive material is a photo-sensitive resin, and the said radiation comprises optical radiation, and preferably ultraviolet radiation. Optical radiation sources are very easy to use, and this type of radiation makes it possible conveniently to use even a very complex and high-performance optical system. Moreover, there is on the market a wide range of photo-sensitive resins which make it possible to obtain a precise resist without difficulties. Ultraviolet radiation is very useful for differentiating zones for forming an image in a photo-sensitive resin, since it can easily exert an effect on the polymerization of the resin. There are photo-sensitive resins referred to as negative and photo- sensitive resins referred to as positive which behave in an opposite manner under the effect of ultraviolet radiation, that is to say for example either they cure by polymerization under the action of an intense light and become insoluble in a certain number of solvents, or, on the other hand, they are destroyed and become soluble.

In the case of utilization of an optical radiation, the face of the sheet opposite to that in which the pattern is to be etched is advantageously covered with an opaque layer prior to exposure to optical radiation. In the case of a glass which is substantially transparent to the optical radiation, as is generally the case with the majority of glasses, this precaution substantially increases the precision of the etching and the resolution of the pattern obtained. In fact, in the case of a transparent material, the optical reflectance on the opposite face of the substrate depends on the support on which the substrate is placed, and may thus vary greatly from one place to another depending on the appearance of the support and its surface contact with the glass. As the insolation of the photo-sensitive resin likewise depends on the return path of the light radiation through the resin, that is to say on the reflection on the opposite face, the danger exists that the result will vary greatly from one place to another in the substrate. The deposition of an opaque layer on the opposite face makes it possible to obtain a regular and controlled reflectance, thus obtaining a better result.

Instead of or in combination with this opaque layer deposited on the opposite face, the said photosensitive resin is advantageously a resin which is transparent to optical radiation which becomes absorbent when exposed to this radiation. This resin thus greatly reduces the influence of the reflectance on the opposite face.

Advantageously, a contrast-increasing layer is deposited on the photo-sensitive resin prior to exposure to the luminous radiation. These special layers have the particular feature of being opaque before exposure and becoming transparent under the action of the radiation, which means that the strongly illuminated zones will become transparent first. The increase in contrast resulting therefrom promotes the obtaining of a better defined pattern and hence of a more precise etching.

Advantageously, the said face of the substrate is subjected to a low-energy ion attack by means of an oxygen-based plasma before etching, so as substantially to expose that face over the pattern to be etched. This precaution facilitates the action of the etching medium and makes it possible to produce extremely fine patterns.

As explained above, the radiation may be that of a laser beam and the pattern may be produced by means of relative movement between this radiation and the substrate. Use may be made of a single concentrated laser beam which traces the desired pattern, or a multibeam laser formed by an interferential technique may be used. Preferably, however, the radiation-sensitive material is exposed to said radiation through a mask. The mask represents a pattern which is determined by the pattern to be etched. As it is placed between the source of the radiation and the glass covered with sensitive material, the radiation reaches the sensitive material only at certain points, as a function of the pattern to be etched, so that it is possible to generate an image of the desired pattern.

Depending on the nature of the sensitive material selected, the mask may represent the pattern to be etched in a manner such as to allow the radiation to pass where etching is desired, or conversely in a manner such as to mask the radiation at these points.

The utilization of a mask placed in the path of the radiation makes it possible to obtain a resist which is precise, of high resolution and readily reproducible.

According to some preferred embodiments of the process according to the invention, the said mask represents only a portion of the entirety of the pattern to be etched, and various portions of the sensitive material are successively exposed through said mask in order to form said latent image. It is thus possible to etch patterns of large dimensions, provided they possess a repetitive motif, by means of a very small mask, that is to say a mask which is relatively inexpensive as compared wiLh a mask comprising a whole pattern.

According to other preferred embodiments of the invention, the mask represents the entirety of the pattern to be etched. This procedure makes it possible to produce accurately patterns having a non-repetitive motif, or where the connection between the identical motifs will not tolerate any offsetting. This however requires the use of a mask whose size is that of the pattern to be etched, or the use of a lens apparatus and an insolation apparatus sufficient to accommodate the entire pattern. The pattern may for example have a diameter of 13 cm or of 30 cm.

When a mask is used, in order to make it possible to obtain very high resolution of the lines of the pattern to be etched, particularly when the latter are extremely fine and very close to one another, it is necessary to place the mask as close as possible to the sensitive material to be irradiated, in order to avoid any scattering of the beam of radiation between the mask and the said material. In some cases, depending on the fineness and closeness of the lines of the pattern and on the accepted tolerance, it will even be necessary to press the mask against the sensitive material to be irradiated. This latter technique requires a resistant mask in order that it should not be damaged, which would impair the reproducibility obtainable from the same mask.

Preferably, the radiation is focused on the sensitive material. This technique makes it possible to obtain a well defined image. When a mask is used, this technique prevents contact between the mask and the sensitive material to be irradiated, while ensuring accurate reproduction of the pattern to be etched. When optical radiation is used, for example, it is possible, in accordance with this alternative embodiment of the process according to the invention, to use an optical system, comprising for example a mirror and lenses, which makes it possible to focus very accurately on the sensitive material while avoiding any contact with the mask. The latter may even be located at a relatively long distance from the sensitive material to be irradiated. For certain other types of radiation, focusing based on the establishment of a magnetic field may be used.

The etching medium must be selected in a manner such that it attacks the glass without impairing the resist. The etching medium may be a liquid medium or a gaseous or plasma medium.

According to some preferred embodiments of the process according to the invention, the etching medium is a liquid. It is possible, for example, to use hydrofluoric acid and/or a fluorine salt in aqueous solution. These solutions make it possible to attack a network of siliceous material without difficulty.

The reactivity of the etching medium towards the glass will preferably be adjusted in a manner such that the duration of attack in order to obtain the desired depth is not too short, for example that it is greater than 1 minute. This precaution makes it easier to control the depth of attack, and hence to obtain good reproducibility, since it permits a certain tolerance in the treatment time which is not totally negligible. Consequently, it will be preferable to use an etching medium containing a fluorine salt, such as NaF for example, in aqueous solution and in weak concentration, for example less than 1% by weight of fluoride.

Preferably, the liquid etching medium also contains a polishing agent. For very precise and highresolution engravings, it is often necessary for the etched areas to possess a relatively low rugosity. In certain cases of relatively shallow etching, it is necessary to ensure that the rugosity does not become such that it is no longer negligible relative to the depth of the etching. By incorporating a polishing agent in the etching medium, it is possible to reduce the rugosity in a manner such as to render it negligible relative to the etched depth and to obtain a profile which is less susceptible to the stresses induced by the tempering treatment. It is possible to add a polishing agent which acts on the size and/or the number of the points of attack and/or which assists removal of the etching reaction products from the etching reaction site. For example, it is advantageous to add sulphuric and/or phosphoric acid as polishing agent.

According to other preferred embodiments of the process according to the invention, the etching medium is a plasma (containing fluorine ions) capable of effecting an ion attack on the substrate. This type of attack makes it possible to obtain, with high precision, etched patterns whose lines are extremely fine.

It is preferable to choose a plasma whose active ions comprise argon ions, which permits a highly directional attack.

The said plasma comprises a fluorinated compound for the provision of fluorine ions. It is possible, for example, to introduce into the said plasma fluorinated hydrocarbons such as $C_2F_4$ and in particular freons such as $CHF_3$. These fluorinated products are particularly effective in the case where silicon is present in the face to be etched. In effect, in the presence of electrons in the plasma, formation takes place of fluorinated radicals which are highly reactive towards a silicon-based network, which accentuates the corrosiveness of the plasma towards the siliceous material. As a result $SiF_4$ forms, which is volatile and facilitates the removal of material. This likewise permits more accurate attack.

Preferably, the average energy induced into the plasma ions when they contact the surface is less than 50 eV, and preferably less than 20 eV. This makes it possible to prevent the ions from penetrating too deeply into the face to be etched and is beneficial for low rugosity. For a depth of attack of about 70 nm, an energy in the vicinity of 4 or 5 eV may be considered as minimum. The pressure during the ionic attack should not be too high, so that the mean free path of the ions is augmented and in order to avoid deviation, so as to form a cleanly etched groove having symmetrical sides.

The process according to the invention makes it possible to produce any type of pattern, such as for example a manufacturer's mark or a decoration, in a precise manner on the chemically tempered glass. It also makes it possible to produce very fine lines with good precision. Lines of he order of one-tenth of a separated by an interval having the same order of magn tude, can be formed without difficulty.

Preferably, however, at least one line in the pattern to be etched possesses a width less than 1.5 $\mu$m, and preferably the interval between two adjacent lines on the pattern to be etched is less than 2 $\mu$m. Such fine and closely adjacent etched lines have not previously been obtained on tempered glass. It is in this case that the invention is of greatest value.

According to some preferred embodiments, the process according to the invention is applied for the manufacture of a data storage disc.

In some such embodiments, the groove pattern is etched to form a series of concentric circles whose pitch is less than 2 $\mu$m, while in other such embodiments, the groove pattern is etched to form a spiral whose pitch is less than 2 $\mu$m. Each of these features promotes a high data storage capacity of the disc.

In such embodiments, it is preferred that the bottom of the groove pattern has a rugosity Ra below 10 nm and preferably below 5 nm. This promotes a high signal to noise ratio which is beneficial for locating stored data. Such a low rugosity can readily be obtained by taking certain precautions during etching, for example by using a rather low energy plasma ion attack or a polishing agent in a liquid etching medium, as described above.

Advantageously, the etching is performed so that the sides of the groove have a substantially symmetrical inclination relative to an axis perpendicular to the bottom of the groove. This makes it eaier to process signals due to light reflected from the groove.

Preferably, the etched groove pattern is address wise modulated.

In some preferred embodiments, the etched groove pattern is over-coated with a data recording layer. Alternatively, it is preferred that the etched groove pattern is data-wise modulated.

According to some other preferred embodiments, the process according to the invention is applied for the manufacture of matted glass. Such glass is useful for reducing or avoiding unwanted reflections.

In some such preferred embodiments, the sheet is etched with grooves disposed mesh-wise to form a grid pattern, the dimension of the mesh being less than 0.5 $\mu$m, and wherein the total optical reflectance of the etched face within the visible region of the spectrum is less than 4%. The width of the lines to be etched may be substantially equal to the width of the interstices between the lines. The process according to the invention is particularly advantageous for etching such a pattern whose mesh is microscopic. In this case, a perfectly repetitive motif can be reproduced by using a mask which represents only part of the grid and can thus be re-used many times to enable the entire pattern to be etched.

The etching of such a grid pattern, whose mesh posesses dimensions less than a micrometre, by means of a process according to the invention, makes it possible to produce a very non-reflective glass, that is to say glass with a high optical transmittance, as described above in the present specification.

In order to promote such desired optical properties, the grooves are etched to a depth greater than 0.1 $\mu$m, and/or the dimension of the mesh of the grid is below 0.1 $\mu$m.

Advantageously, the glass to be tempered is float glass. Float glass is easily produced with a very high degree of surface planeity, because it is fire-polished as it floats on a bath of molten metal, usually tin.

However because float glass is produced by flotation on a bath of molten tin, it happens that there is a disequilibrium as between the ion populations in opposite surface layers of the glass. That side which was in contact with the bath of tin contains tin ions which have diffused into the glass, and it is poorer in alkali metal ions than the opposite face of the glass. As a result, difficulties can sometimes arise during chemical tempering of float glass, especially when the float glass is thin, and it can happen that the tempering process engenders a curvature to the glass. It is possible to subject the float glass to a sodium ion diffusion pretreatment by placing the glass in contact with a bath of molten sodium nitrate at a temperature of between 350° C. and 600° C. Sodium ions from the bath diffuse into the surface of the glass to re-establish equilibrium between the sodium and silicon ions at the two faces of the glass. After cooling and washing the glass may then be subjected to a chemical tempering treatment, for example by placing it in contact with a bath of molten potassium nitrate at 470° C. for a sufficient period of time.

An alternative pretreatment is to polish the tin face of the float glass before tempering. Such polishing may be effected mechanically or chemically, and since the problem arises in a thin surface layer, it is usually enough to remove a layer some 5 $\mu$m in thickness.

We have now discovered a rather simpler pretreatment which substantially reduces the risk that float glass will become curved when it is subjected to a subsequent chemical tempering treatment. Accordingly, it is preferred that prior to tempering, the float glass is maintained at an elevated temperature not exceeding 550° C. to promote ionic migration within the glass and render the sodium ion population at the two faces of the float glass more nearly equal. For example, the glass may be maintained at a temperature of 465° C. for between 6 and 16 hours. It is desirable to avoid too high a temperature during this pretreatment in order that the glass shall not deform under its own weight. This is a very simple pretreatment which very substantially reduces any risk that the glass will become curved when subsequently tempered. The glass may be chemically tempered immediately thereafter, without intermediate cooling.

The invention extends to an article comprising tempered glass which has been etched by a process as described above.

Figure 2:
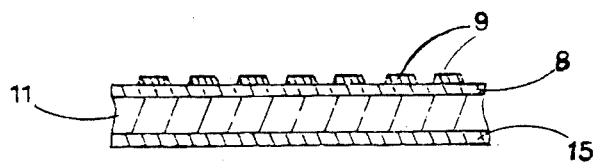
Figure 3:
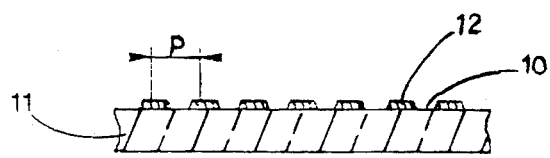
Figure 4:

Certain preferred embodiments of the invention will now be described by means of example only, and with reference to the accompanying diagrammatic drawings, in which:

FIG. 1 shows diagrammatically a manner of exposing material through a mask as a stage in forming a resist, FIG. 2 shows a partial view in section of a glass sub provided with a resist and ready to be subjected to the action of a etching medium according to the invention, FIG. 3 shows a partial view in section of a glass sheet bearing an etched pattern according to the inve , and FIG. 4 shows a partial view in section of another sheet of glass bearing an etched pattern according to the invention.

For greater clarity, in view of the extremely small dimension of the etched patterns, the figures are not to scale.

FIG. 1 shows a sheet of chemically tempered glass 1, on one face of which a radiation-sensitive layer of material 2 has been deposited. In this particular example of a process according to the invention, the sheet 1 is a sheet of alkali-lime glass of ordinary composition with a thickness of 1.3 mm, and the layer 2 is a layer of HPR 204 photo-° ;ensitive resin from Olin-Hunt Chemical, and the radiation 4 is ultraviolet radiation.

The chemical tempering was effected by placing the glass in contact with molten potassium nitrate at a temperature of 465° C. for between two and a half hours and eight hours in order to achieve the desired degree of compressive surface stress of 450 to 600 MPa in the surface of the glass. The glass was float glass, and prior to tempering it was maintained at a temperature of 465° C. for a period of 8 hours to re-establish equilibrium of the ionic populations of opposite surface layers of the glass. In a variant, the glass used was drawn glass, and this pretreatment was omitted.

The layer of sensitive material 2 is exposed to radiation 4, through a mask 3.

In order to avoid any problem with reflectances which may differ from one point to another on the rear face of the sheet 1 as a function of the state and the form of the support on which the sheet is arranged, which reflectances could modify the degree of exposure of the sensitive material 2, this rear face has been previously covered with a uniform layer 5 which is opaque to the radiation used. In the particular example, an aluminium layer 70 nm thick has been used. This thickness has been selected so that this layer is totally etched away during the etching of the glass by an etching medium which will be described below. By virtue of this uniform layer, the reflectance on the rear face of the sheet is uniform and regular, which permits regular exposure of the sensitive material.

The mask 3 is placed almost in contact with the layer of sensitive material 2, to avoid scattering of the radiation between the mask and the layer. Actual contact has however been avoided in order not to risk damaging the mask. The mask 3 bears a positive imprint of the pattern which it is desired to etch.

In the particular example described, the mask 3 has been produced in the following manner: a quartz substrate 6 has been chosen, because of its good transparency to ultraviolet radiation and its low thermal expansion. An opaque film comprisigg a layer of slightly oxidized black chromium has been deposited on this substrate. A layer of unpolymerized PMMA resin has been deposited on this film. This substrate has been placed on a rotating support and the resin has been imprinted by a laser beam moving linearly in a precise and micrometric manner. After development of the resin and ionic attack of the chromium layer, a mask has been obtained, comprising a quartz sheet 6 bearing chromium strips 7 which form the image of a spiral.

After development by means of the solvent provided by the same company as the photo-sensitive resin, what remains of the latter on the substrate forms the resist which will protect certain portions of the surface of the glass from the action of the etching medium which will be applied as described below. Before this operation, the substrate provided with the resist has been subjected for 4 minutes to the action of an oxygen plasma having a power of 180 watts, in order to expose the glass clearly at the poins to be etched.

The glass sheet provided with the resist is then subjected to the action of an etching medium. In order to do this, it is immersed for at least one minute in a solution at 18° C. of filtered water containing about 1% HF, and 5% to 10% $H_2SO_4$ as polishing agent, and then rinsed for several minutes. In a variant, we have used $H_3PO_4$ in place of the $H_2SO_4$. The resist is then removed by etching away for several minutes with fuming $HNO_3$. The result obtained was a sheet of chemically tempered glass etched with grooves in accordance with the pattern imposed by the mask. The rugosity of the grooves was about 3 nm.

The stresses induced by the chemical tempering treatment were substantially unaffected by the etching treatment. The etched sheet had a resistance to breakage greater than 350 MPa at its edges and greater than 500MPa away from its edges.

In an alternative embodiment of this example, the exposure of the photo-sensitive resin to the radiation was carried out without the intervention of the mask 3. In order to do this, use was made of a laser beam focused precisely on the sensitive material. The sheet of glass 1 provided with the resin layer and the aluminium layer 5 was arranged on a rotating support. The laser beam was moved in a straight line. The combination of the two movements made it possible to differentiate zones in the photo-sensitive material 2, in accordance with a spiral having a pitch of the order of micrometres.

In another embodiment of this example, after tempering, and prior to the coating of the face of a glass sheet 11 with the photo-sensitive resin 2, a uniform layer of $SiO_2$ having a thickness of 70 nm was deposited on the surface of the glass. After exposure with the intervention of the mask 3, development of the photo-sensitive resin and exposure of the $SiO_2$ at the points to be etched, as in the basic example above, a substrate as shown in FIG. 2 was obtained. In this figure, the glass sheet 11 bears, on the side of the face to be etched, a 70 nm layer 8 of $SiO_2$ on which is provided an organic resist comprising the offset films 9. The substrate as shown in FIG. 2 was then subjected to the action of an etching medium.

In this alternative embodiment, the etching medium was a plasma. This plasma comprised argon ions, and a fluorinated product such as $CHF_3$ was introduced into this plasma. The electrical discharge was produced in a vessel in which the vacuum was maintained between $3 \times 10^{-3}$ torr and $8 \times 10^{-2}$ torr, the voltage difference was 350 V, and the spacing was adjusted so that the average energy induced into the plasma ions when they contacted the surface under attack was about 18 eV. At the points not protected by the resist, the $SiO_2$ layer was subjected to the ionic attack giving rise to the formation, in particular, of volatile $SiF_4$ and hence to removal of material. When the plasma reached the surface layer of the glass, non-volatile compounds such as $CaF_2$ and $AlF_3$ formed, and these slowed down the reaction very substantially. It was thus possible to obtain an etched pattern with a constant thickness over its entire surface area, and with a very low rugosity at the base of the groove pattern. The resist was then removed in the same manner as above, and the aluminium layer 15 was likewise etched away.

The sheet of glass according to the invention which was thus obtained is shown in partial section in FIG. 3. In this figure the etched lines are indicated at 10 and are separated by projecting portions 12 formed of $SiO_2$ In a practical example, the grooves 10 represent the grooves of a spiral whose pitch p is 1.6 μm. This sheet of glass possesses the shape of a disc having a diametrr of 133 mm. This disc is intended to serve as a support for a data recording layer. In other examples of the process, such a disc is etched with a pattern of concentric circles.

FIG. 4 shows a sheet 21 of ordinary alkali-lime glass bearing a pattern etched in one of its faces. The pattern is etched in the actual surface of the glass. This pattern forms a grid whose mesh has a size d of approximately 0.3 μm. The etching has a depth of 0.1 μm. This face of the glass sheet possesses an optical reflectance, in the visible spectrum of between 350 nm and 750 nm, below 1%, about 0.6%, whereas it is about 4% without the etched pattern. This therefore makes it possible to obtain a glass sheet of high optical transmittance without the presence of additional layers especially intended for this purpose.

We claim:

1. An article comprising a glass sheet and having an etched pattern, characterised in that said glass sheet is a chemically tempered glass sheet, and the pattern comprises one or more grooves etched into the article using fluorine ions to a depth of less than 2 μm.

2. An article according to claim 1, wherein the pattern comprises closely spaced groove portions which have a width of less than 10 μm, and the spacing between two adjacent groove portions is less than 10 μm.

3. An article according to claim 2, wherein the etched groove portions have a width of less than 1.5 μm and a depth greater than 50 nm, and in that the interval between two adjacent groove portions is less than 2 μm.

4. An article according to claim 1 wherein the pattern is etched into a surface layer of the tempered glass sheet.

5. An article according to claim 1 wherein the etched groove portions are etched into a layer of inorganic material deposited on the tempered glass, which material has a hardness which is substantially equal to or greater than the hardness of the glass.

6. An article according to claim 5, wherein such inorganic layer comprises substantially a single constituent. tuent.

7. An article according to claim 6 wherein such inorganic layer is a layer of $SiO_2$.

8. An article according to claim 5 wherein the depth of the etched groove portions is substantially equal to the thickness of the inorganic layer.

9. An article according to claim 1 wherein it comprises an anti-reflecting layer.

10. An article according to claim 1 wherein said glass sheet is a float glass sheet..

11. An article according to claim 1 wherein said glass sheet has a thickness below 2 mm.

12. An article according to claim 1 wherein the pattern is etched on a face of the article with grooves disposed mesh-wise to form a grid pattern, the dimension of the mesh being less than 0.5 μm, and wherein the total optical reflectance of that face within the visible region of the spectrum is less than 4%.

13. An article according to claim 12, wherein the depth of the etched grooves is greater than 0.1 μm.

14. An article according to claim 12 wherein the dimension of the mesh of the grid is below 0.1 μm.

15. An article according to claim 1 wherein the etched groove portions form a spiral guide track whose pitch is less than 2 μm.

16. An article according to claim 1 wherein etched grooves form a guide track being a series of concentric circles whose pitch is less tha 2 μm.

17. An article according to claim 15, which is a disc.

18. An article according to claim 15 wherein the bottom of said guide track possesses a rugosity Ra below 10 nm an preferably below 5 nm.

19. an article according to claim 15 wherein the sides of said guide track posses a substantially symmetrical inclination relative to an axis perpendicular to the bottom of the track.

20. A disc according to claim 17 wherein such disc is adapted for the storage of recorded data.

21. A disc according to claim 20, wherein the etched pattern is address-wise modulated.

22. A disc according to claim 20 wherein the etched pattern i sover-coated with a data recording layer.

23. A disc according to claim 20 wherein the etched pattern is data-wise modulated.

24. A process of manufacturing an article comprising a glass sheet and having an etched pattern, characterised in that a glass sheet is chemically tempered, a layer of radiation-sensitive material is applied to at least one face of that sheet and is exposed to radiation to form a latent image of a desired groove pattern, in that the radiation-sensitive material is developed to form a resist and in that the sheet is exposed, through the resist, to the action of fluorine ions in an etching medium to etch the desired groove pattern to a depth of less than 2 μm.

25. A process according to claim 24, applied for the manufacture of a data storage disc.

26. A process according to claim 25, wherein the groove pattern is etched to form a spiral whose pitch is less than 2 μm.

27. A process according to claim 25, wherein the groove pattern is etched to form a series of concentric circles whose pitch is less than 2 μm.

28. A process according to claim 25 wherein the bottom of the groove pattern has a rugosity Ra below 10 nm and preferably below 5 nm.

29. A process according to claim 25 wherein the etching is performed so that the sides of the groove have a substantially symmetrical inclination relative to an axis perpendicular to the bottom of the groove.

30. A process according to claim 25 wherein the etched groove pattern is address-wise modulated.

31. A process according to claim 254 wherein the etched groove pattern is over-coated with a data reocrding layer.

32. A process according to claim 25 wherein the etched groove pattern is data-wise modulated.

33. A process according to claim 24 applied for the manufacture of matted glass.

34. A process according to claim 33, wherein the sheet is etched with grooves disposed mesh-wise to form a grid pattern, the dimension of the mesh being less than 0.5 $\mu$m, and wherein the total optical reflectance of the etched face within the visible region of the spectrum is less than 4%.

35. A process according to claim 33 wherein the grooves are etched to a depth greater tha 0.1 $\mu$m.

36. A process according to claim 33 wherein the dimension of the mesh of the grid is below 0.1 $\mu$m.

37. A process according to claim 24 wherein the resist is eliminated from the substrate after the action of the etching medium.

38. A process according toe claim 24 wherein an inorganic layer is present on a face of the glass prior to the deposition of the radiation-sensitive material, and in that the material removed during etching comprises material originating from this inorganic layer.

39. A process according to claim 38, wherein the inorganic layer is deposited in a thickness substantially equal to the depth of the pattern to be eched.

40. A process according to claiam 39, wherein the action of the etching medium is stopped when the latter reaches the glass over substantially the entire area of the pattern to be etched.

41. A process according to claim 24 wherein the resist is constituted by the radiation-sensitive material after exposure to the radiation.

42. A process according to wherein the radiation-sensitive material is a photo-sensitive resin and in that the radiation comprises optical radiation and preferably ultraviolet radiation.

43. A process according to claim 42, wherein the face of the sheet opposite to that in which the pattern is to be etched is covered with an opaque layer prior to the exposure ot optical radiation.

44. A process according to claim 42 wherein the photo-sensitive resin is a resin which is transparent to optical radiation which becomes absorbent when exposed to this radiation.

45. A process according to claim 42 wherein a contrast-increasing layer is deposited on the photo-sensitive resin prior to exposure to the optical radiation.

46. A process according to claim 42 wherein the face to be etched is subjected to a lowenergy ion attack by means of an oxygen-based plasma before etching, so as substantially to expose that face over the pattern to be etched.

47. A process according to claim 24 wherein the radiation-sensitive material is exposed to said radiation through a mask.

48. A process according to claim 47 applied for the manufacture of matted glass, wherein said mask represents only a portion of the pattern to be etched, and in that various portions of the sensitive material are successively exposed through said mask in order to form said latent image.

49. A process according to claim 47 wherein the mask represents the entirety of the pattern to be etched.

50. A process according to any of claims 24 to 49 wherein the radiation is focused on the sensitive material.

51. A process according to claim 24 wherein the etching medium is a liquid.

52. A process according to claim 51, wherein the liquid etching medium also contains a polishing agent.

53. A process according to claim 24 wherein the etching medium is a plasma containing fluorine ions.

54. A process according to claim 53 wherein the energy induced into the plasma ions is less than 50 eV, and preferably less than 20 eV.

55. A process according to claim 24 wherein the glass which is tempered is float glass.

56. A process according to claim 55, wherein prior to tempering, the float glass is maintained at an elevated temperature not exceeding 550° C. to promote ionic migration within the glass and render the sodium ion population at the two faces of the float glass more nearly equal.

57. An article comprising tempered which has been etched by a process according to claim 24.

* * * * *